(12) United States Patent
Gurary et al.

(10) Patent No.: US 8,562,746 B2
(45) Date of Patent: Oct. 22, 2013

(54) SECTIONAL WAFER CARRIER

(75) Inventors: Alexander I. Gurary, Bridgewater, NJ (US); Joseph Arthur Kraus, Hamilton, NJ (US); Ajit Paranjpe, Basking Ridge, NJ (US); William E. Quinn, Whitehouse Station, NJ (US); David Albert Crewe, Basking Ridge, NJ (US)

(73) Assignee: Veeco Instruments Inc., Plainview, NY (US)

( * ) Notice: Subject to any disclaimer, the term of this patent is extended or adjusted under 35 U.S.C. 154(b) by 338 days.

(21) Appl. No.: 12/968,900

(22) Filed: Dec. 15, 2010

(65) Prior Publication Data

US 2012/0156374 A1   Jun. 21, 2012

(51) Int. Cl.
C23C 16/00 (2006.01)
C23F 1/00 (2006.01)
H01L 21/306 (2006.01)

(52) U.S. Cl.
USPC ........... 118/730; 118/715; 118/724; 118/728; 156/345.1; 156/345.51; 156/345.55

(58) Field of Classification Search
USPC ............ 118/728, 730, 715, 724; 156/345.51, 156/345.52, 345.55, 345.1
See application file for complete search history.

(56) References Cited

U.S. PATENT DOCUMENTS

| | | | |
|---|---|---|---|
| 7,736,528 B2 * | 6/2010 | Okita et al. | 216/58 |
| 2005/0011436 A1 | 1/2005 | Liu | |
| 2006/0102081 A1 * | 5/2006 | Ueno et al. | 118/728 |
| 2011/0049779 A1 | 3/2011 | Egami et al. | |

FOREIGN PATENT DOCUMENTS

| | | |
|---|---|---|
| JP | 10-167885 | 6/1998 |
| JP | 10-167886 | 6/1998 |
| JP | 2004-128271 | 4/2004 |
| JP | 2006066417 A | 3/2006 |
| KR | 100854974 B1 | 8/2008 |
| KR | 20090038606 A | 4/2009 |

OTHER PUBLICATIONS

International Search Report and Written Opinion for application PCT/US2011/061615 dated May 18, 2012.

* cited by examiner

*Primary Examiner* — Jeffrie R Lund
*Assistant Examiner* — Benjamin Kendall
(74) *Attorney, Agent, or Firm* — Lerner, David, Littenberg, Krumholz & Mentlik, LLP

(57) ABSTRACT

A structure for a chemical vapor deposition reactor includes a support element defining oppositely-facing substantially planar upper and lower surfaces and a vertical rotational axis substantially perpendicular to the upper and lower surfaces, and a plurality of carrier sections releasably engaged with the support element. Each carrier section can include oppositely-facing substantially planar top and bottom surfaces and at least one aperture extending between the top and bottom surfaces. The carrier sections can be disposed on the support element with the bottom surfaces of the carrier sections facing toward the upper surface of the support element, so that wafers can be held in the apertures of the carrier sections with one surface of each wafer confronting the support element and an opposite surface exposed at the top surface of the carrier sections.

22 Claims, 6 Drawing Sheets

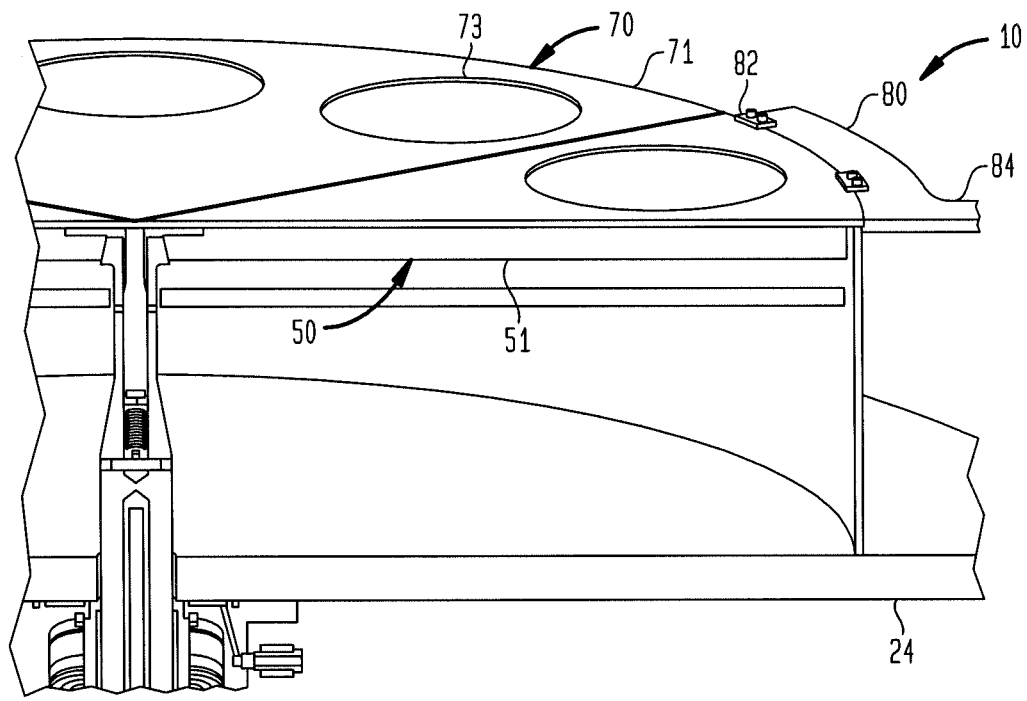
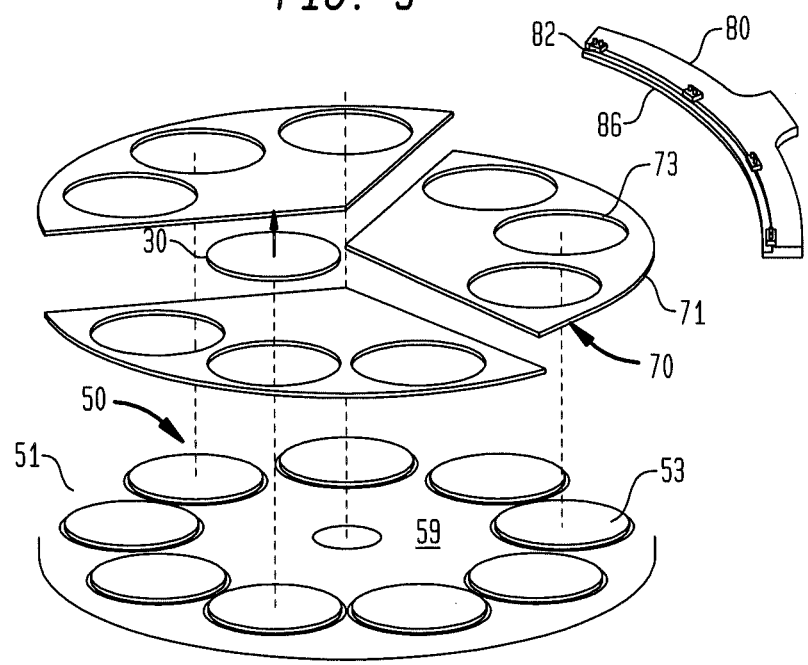

SECTIONAL WAFER CARRIER

BACKGROUND OF THE INVENTION

The present invention relates to wafer processing apparatus, to exhaust systems for use in such processing apparatus, and to methods of methods of wafer processing.

Many semiconductor devices are formed by processes performed on a substrate. The substrate typically is slab of a crystalline material, commonly referred to as a "wafer." Typically, a wafer is formed by growing a large crystal and slicing the crystal into the shape of a disc. One common process performed on such a wafer is epitaxial growth.

For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 500-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other electronic and optoelectronic devices can be fabricated in this way.

In a typical chemical vapor deposition process, numerous wafers are held on a component commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor devices.

For example, if a gallium indium nitride layer is deposited, variations in wafer surface temperature or concentrations of reactive gasses will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier. The used gas is evacuated from the reaction chamber through exhaust ports disposed below the wafer carrier and distributed around the axis of the spindle, typically near the periphery of the chamber.

The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

Although considerable effort has been devoted in the art heretofore to optimization of such systems, still further improvement would be desirable. In particular, it would be desirable to provide easier loading of wafers and the wafer carrier into the reaction chamber, particularly for relatively large wafer carriers.

SUMMARY OF TEE INVENTION

A structure for a chemical vapor deposition reactor, a carrier section for transporting wafers into a chemical vapor deposition reactor, a support element for a chemical vapor deposition reactor, and a method of wafer processing are provided. One aspect of the invention provides a structure for a chemical vapor deposition reactor. The structure includes a support element defining oppositely-facing substantially planar upper and lower surfaces and a vertical rotational axis substantially perpendicular to the upper and lower surfaces, and a plurality of carrier sections releasably engaged with the support element. Each carrier section can include oppositely-facing substantially planar top and bottom surfaces and at least one aperture extending between the top and bottom surfaces. The carrier sections can be disposed on the support element with the bottom surfaces of the carrier sections facing toward the upper surface of the support element, so that wafers can be held in the apertures of the carrier sections with one surface of each wafer confronting the support element and an opposite surface exposed at the top surface of the carrier sections.

In one example, the one surface of each wafer confronting the support element can contact the support element. In a particular example, each carrier section can further include an aperture circumferential surface bounding each aperture and extending between the top and bottom surfaces of the carrier section. Each carrier section can further include at least one carrier locating feature engaged with the at least one support locating feature. The carrier and support locating features can be adapted to prevent the carrier section from disengaging from the support element when the support element is rotated about the rotational axis. Each carrier section can further include at least one carrier element projecting inwardly from each aperture circumferential surface. Each carrier element can be adapted to hold a wafer.

In a particular embodiment, the structure can further include a reaction chamber having an interior, a gas inlet structure communicating with the interior of the chamber for admitting process gasses to form a deposit on wafers held within the interior, a heating element mounted within the reaction chamber, and a spindle mounted in the reaction chamber, the support element being mounted onto the spindle for rotation therewith about the vertical rotational axis. In one example, the at least one aperture of each carrier section can be a plurality of apertures. In an exemplary embodiment, the support element can be generally disc-shaped and each carrier section can be generally in the form of a sector of a circle. In a particular example, the support element can further include at least one platform projecting upwardly from the upper surface of the support element. Each platform can define a top surface and a platform circumferential surface extending between the top surface thereof and the upper surface of the support element. Each platform can be engaged within a corresponding one of the apertures.

In one example, the support locating feature can include at least one of the platforms. In an exemplary embodiment, a portion of the platform circumferential surface that is closest to the rotational axis can define a first acute angle with respect to the upper surface of the support element. In a particular example, an inner portion of the aperture circumferential surface that is closest to the rotational axis can define a second acute angle with respect to the bottom surface of the carrier section. In a particular embodiment, the first acute angle and the second acute angle can be approximately the same. In one example, an outer portion of each aperture circumferential surface that is farthest from the rotational axis can define an obtuse angle with respect to the bottom surface of the carrier section.

In an exemplary embodiment, the structure can further include a wafer positioned in each aperture. A thickness of the carrier section between the top and bottom surfaces thereof can be greater than a distance between the upper surface of the support element and a top surface of the wafer. In a particular example, each platform can be adapted to hold a wafer disposed in the corresponding one of the apertures above the carrier elements. In a particular embodiment, each platform can further define at least one recess extending inward from the platform circumferential surface, and each carrier element can be engaged in a corresponding one of the recesses. In one example, each platform can be adapted to hold a wafer such that a major portion of the lower surface of the wafer is spaced from the top surface of the platform. In an exemplary embodiment, each platform can include at least one support tab projecting upwardly from the top surface thereof. Each support tab can be adapted to hold a wafer such that the entire lower surface of the wafer is spaced from the top surface of the platform.

Another aspect of the invention provides a carrier section for transporting wafers into a chemical vapor deposition reactor. The carrier section includes a body defining oppositely-facing top and bottom surfaces, at least one aperture extending through the body, the body defining a circumferential surface bounding each aperture and extending between the top and bottom surfaces of the body, and a plurality of carrier elements projecting inwardly from the circumferential surface of each said aperture. The carrier elements of each aperture can be adapted to hold a wafer such that an upper surface of the wafer is exposed at the top surface of the body. The carrier section can define engagement surfaces adapted to engage a support element.

In a particular embodiment, the body can define a substantially arcuate peripheral surface. An inner portion of the circumferential surface of each aperture that is farthest from the peripheral surface can define an acute angle with respect to the bottom surface of the body. An outer portion of the circumferential surface of each aperture that is closest to the peripheral surface can define an obtuse angle with respect to the bottom surface of the body. In one example, the acute angle of the inner portion of the circumferential surface of each aperture and the obtuse angle of the outer portion of the circumferential surface of each aperture can be complimentary. In an exemplary embodiment, the circumferential surface of each aperture can be in the form of an oblique circular cylinder.

Yet another aspect of the invention provides a support element for a chemical vapor deposition reactor. The support element includes a body defining oppositely-facing upper and lower surfaces and a vertical rotational axis substantially perpendicular to the upper and lower surfaces and extending approximately through a center of inertia of the body, and at least one platform projecting upwardly from the upper surface of the body. Each platform can define a top surface and a circumferential surface extending between the top surface and the upper surface of the body. The support element can define engagement surfaces adapted to retain one or more carrier sections overlying the upper surface of the body.

In a particular embodiment, an inner portion of the circumferential surface of each platform that is closest to the rotational axis can define an acute angle with respect to the upper surface of the body, the engagement surfaces including the inner portions. In one example, the entire circumferential surface of each platform can define an acute angle with respect to the upper surface of the body. In an exemplary embodiment, the support element can also include a plurality of support tabs projecting upwardly from the top surface of each platform. The support tabs can be adapted to hold a wafer such that a lower surface of the wafer is spaced from the top surface of the platform. In a particular example, the support element can be substantially disc-shaped. In a particular embodiment, the top surface of each platform can be substantially round.

Still another aspect of the invention provides a method of wafer processing. The method includes the steps of holding at least one wafer on a carrier section having top and bottom surfaces so that each such wafer is disposed within an aperture extending through the carrier section from the top surface to the bottom surface and supported on carrier elements of the carrier section projecting into such aperture, placing the carrier section onto an upper surface of a support element so that the carrier section is in an operating position, and while the carrier section is in the operating position on the support element, treating the top surfaces of the wafers. When the carrier section is in the operating position, the bottom surface of the carrier can face the upper surface of the support element, a platform projecting upwardly from the upper surface of the support element can be engaged in each aperture and can support the wafer disposed in such aperture above the carrier elements, and a top surface of each wafer can be exposed at the top surface of the carrier section.

In a particular embodiment, the method can include the step of removing the carrier section from the support element after the treating step so that the wafers are again supported on the carrier elements. In one example, the holding, placing and removing steps can be performed as aforesaid with a plurality of carrier sections so that a plurality of carrier sections are disposed on a single support element during the treating step. In an exemplary embodiment, the support element can be generally disc-shaped and each carrier section can generally be in the form of a sector of a circle. In a particular example, the top surfaces of the carrier sections and the top surfaces of the wafers can cooperatively define a generally planar exposed surface covering a major portion of the support element. In a particular embodiment, the placing step can be performed such that the carrier elements are each engaged in a corresponding recess projecting inwardly from a circumferential surface bounding the platform.

In one example, the placing step can be performed such that the wafer is supported by at least one support tab projecting upwardly from the top surface of the platform, and a lower surface of the wafer is spaced from the top surface of the platform. In an exemplary embodiment, the treating step can be performed while the carrier section and the support element are rotated about a vertical rotational axis. In a particular example, the treating step can be performed such that while the carrier section and the support element are rotated, the carrier section exerts a downward force onto the top surface of the wafer. In a particular embodiment, the treating step can be performed such that while the carrier section and the support element are rotated, the platform projecting from the support element exerts a downward force onto the carrier section.

BRIEF DESCRIPTION OF THE DRAWINGS

FIG. 2 is a fragmentary sectional view depicting an embodiment of elements of the chemical vapor deposition apparatus illustrated in FIG. 1.

FIG. 3 is a perspective exploded view depicting elements of the chemical vapor deposition apparatus illustrated in FIG. 1.

DETAILED DESCRIPTION

Figure 1:
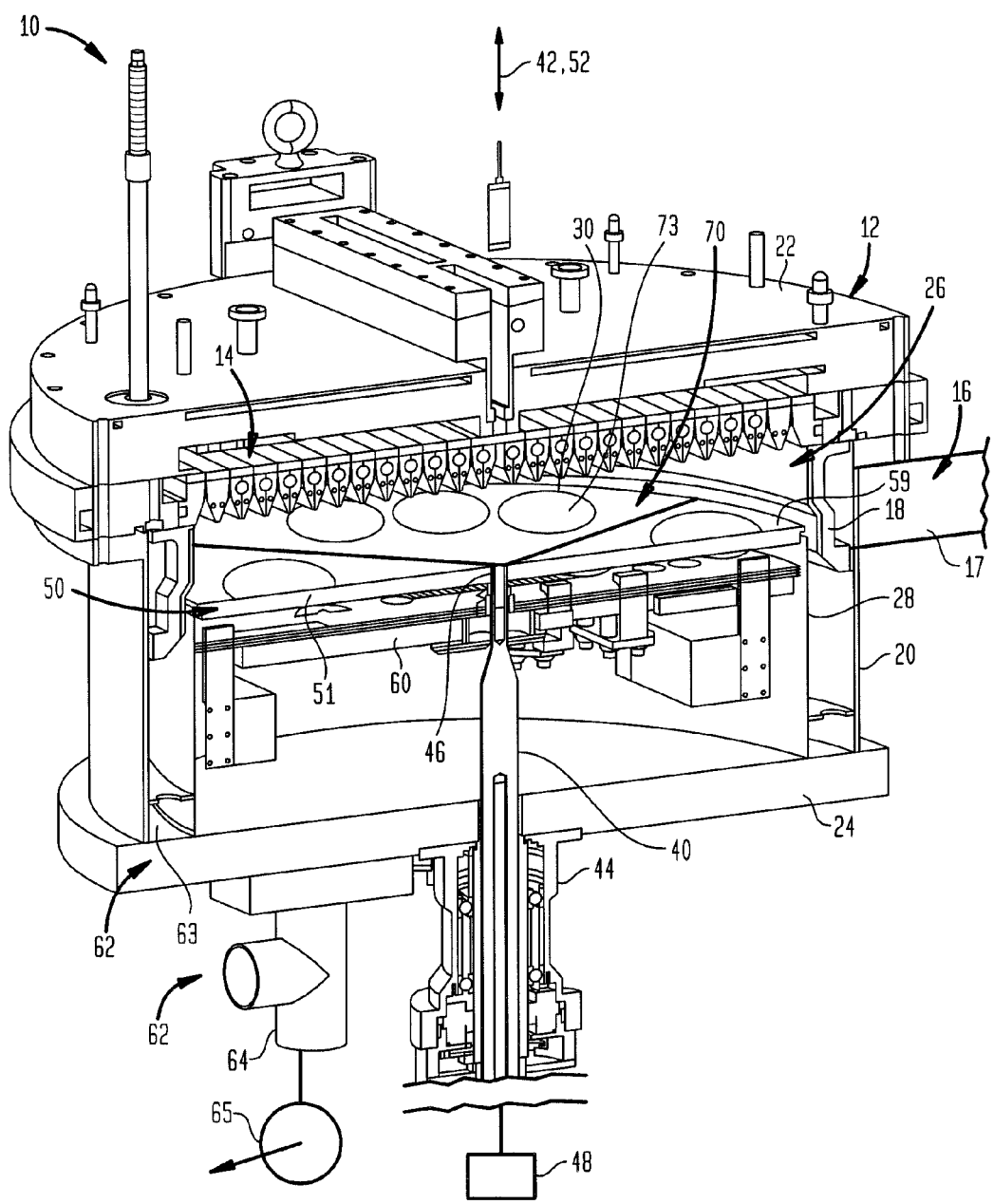
FIG. 1 is a perspective sectional view depicting chemical vapor deposition apparatus in accordance with one embodiment of the invention.

Referring to FIG. 1, a chemical vapor deposition apparatus 10 in accordance with one embodiment of the invention includes a reaction chamber 12 having a gas inlet manifold 14 arranged at one end of the chamber 12. The end of the chamber 12 having the gas inlet manifold 14 is referred to herein as the "top" end of the chamber 12. This end of the chamber typically, but not necessarily, is disposed at the top of the chamber in the normal gravitational frame of reference. Thus, the downward direction as used herein refers to the direction away from the gas inlet manifold 14; whereas the upward direction refers to the direction within the chamber, toward the gas inlet manifold 14, regardless of whether these directions are aligned with the gravitational upward and downward directions. Similarly, the "top" and "bottom" surfaces of elements are described herein with reference to the frame of reference of chamber 12 and manifold 14.

The chamber 12 has a cylindrical wall 20 that extends between a top flange 22 at the top end of the chamber and a base plate 24 at the bottom end of the chamber. The wall 20, the flange 22, and the base plate 24 define an air-tight sealed interior region 26 therebetween that can contain gasses emitted from the gas inlet manifold 14. Although the chamber 12 is shown as cylindrical, other embodiments can include a chamber having another shape, including, for example, a cone or other surface of revolution, a square, a hexagon, an octagon, or any other appropriate shape.

The gas inlet manifold 14 is connected to sources for supplying process gases to be used in the wafer treatment process, such as a carrier gas and reactant gases such as a metalorganic compound and a source of a group V metal. In a typical chemical vapor deposition process, the carrier gas can be nitrogen, hydrogen, or a mixture of nitrogen and hydrogen, and hence the process gas at the top surface of a wafer carrier can be predominantly composed of nitrogen and/or hydrogen with some amount of the reactive gas components. The gas inlet manifold 14 is arranged to receive the various gases and direct a flow of process gasses generally in the downward direction.

The gas inlet manifold 14 can also be connected to a coolant system (not shown) arranged to circulate a liquid through the gas distribution element so as to maintain the temperature of the element at a desired temperature during operation. A similar coolant arrangement (not shown) can be provided for cooling the walls of chamber 12.

The chamber 12 is also provided with an entry opening 16 leading to an antechamber 17, and a moveable shutter 18 for closing and opening the entry opening 16. The shutter 18 can be configured as disclosed, for example, in U.S. Pat. No. 7,276,124, the disclosure of which is hereby incorporated by reference herein.

A spindle 40 is arranged within the chamber so that the central axis 42 of the spindle 40 extends in the upward and downward directions. The spindle is mounted to the chamber by a conventional rotary pass-through device 44 incorporating bearings and seals (not shown) so that the spindle can rotate about the central axis 42, while maintaining a seal between the spindle 40 and the base plate 24 of the chamber 12. The spindle 40 has a fitting 46 at its top end, i.e., at the end of the spindle closest to the gas inlet manifold 14.

The spindle 40 is connected to a rotary drive mechanism 48 such as an electric motor drive, which is arranged to rotate the spindle about the central axis 42. The spindle 40 can also be provided with internal coolant passages extending generally in the axial directions of the spindle within the gas passageway. The internal coolant passages can be connected to a coolant source, so that a fluid coolant can be circulated by the source through the coolant passages and back to the coolant source.

A support element 50 includes a main body 51 which is substantially in the form of a circular disc having a central axis 52. In the operative position shown in FIG. 1, the central axis 52 of the main body 51 is coincident with the axis 42 of the spindle. The body 51 can be formed as a single piece or as a composite of plural pieces. For example, as disclosed in U.S. Published Patent Application No. 20090155028, the disclosure of which is hereby incorporated by reference herein, the main body may include a hub defining a small region of the body 51 surrounding the central axis 52 and a larger portion defining the remainder of the disc-like body. In other embodiments (not shown), the support element 50 can have other shapes, including, for example, a square, a hexagon, or an octagon.

The main body 51 can be formed from materials which do not contaminate the CVD process and which can withstand the temperatures encountered in the process. For example, the larger portion of the support element 50 may be formed largely or entirely from materials such as graphite, silicon carbide, boron nitride, aluminum nitride, or other refractory materials. The body 51 has generally planar upper and lower surfaces extending generally parallel to one another and generally perpendicular to the vertical rotational axis 52 of the support element 50. In one example, the main body 51 can be about 500 mm to about 1000 mm in diameter.

As can be seen in FIG. 3, the support element 50 also includes nine platforms 53 projecting upwardly from the upper surface 59 of the support element and arranged circumferentially about the support element. Each platform 53 is adapted to be removably received in a corresponding aperture 73 of a carrier section 70 (FIG. 3, to be described below). Each platform 53 has a diameter approximately equal to the diameter of a disc-like wafer 30, such that a wafer can be supported on each platform. Each wafer 30 can be formed from a sapphire, silicon carbide, silicon, or other crystalline substrate. Typically, each wafer 30 has a thickness which is small in comparison to the dimensions of its major surfaces. For example, a circular wafer 30 about 2 inches (50 mm) in diameter may be about 430 µm thick or less. Each wafer 30 is disposed on a respective platform 53 with a top surface thereof facing upwardly, so that the top surface of the wafer is exposed at the top surface of the platform. Although nine platforms 53 are shown in FIG. 3, the support element 50 can include any number of platforms, including, for example, two, four, five, six, seven, eight, ten, twelve, or fifteen.

Figure 5:
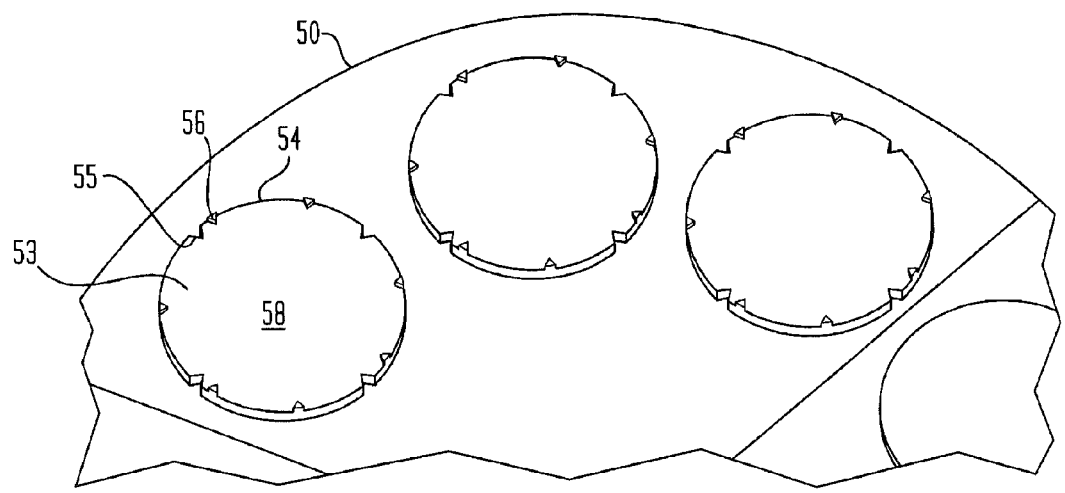
FIG. 5 is a fragmentary top plan view of the support element shown in FIG. 3.

As can be seen in FIG. 5, each platform 53 includes a platform circumferential surface 54 and four recesses 55 extending radially inward therefrom. Each recess 55 is adapted to receive a corresponding carrier element 75 (to be described below) when a corresponding carrier section 70 is engaged with the support element 50. Although four recesses 55 are shown in FIGS. 5 and 6A, each platform 53 can include any number of recesses, including, for example, three, five, six, seven, eight, ten, twelve, or fifteen.

Figure 6A:
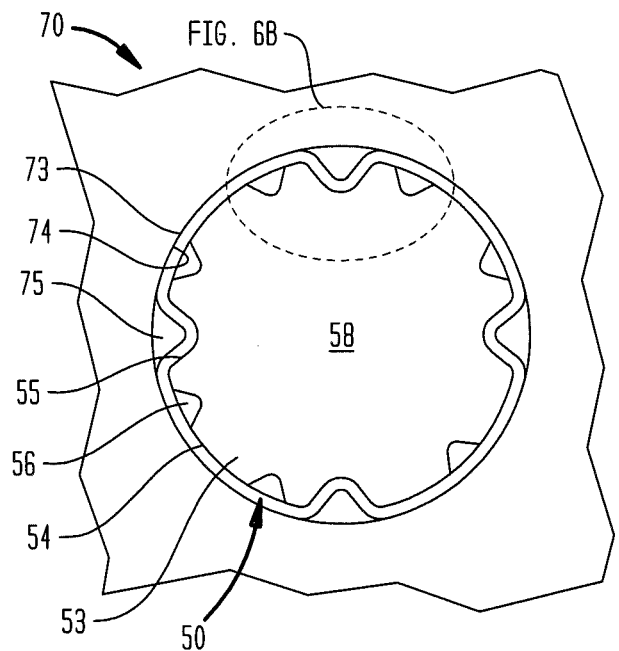
FIG. 6A is a fragmentary top plan view of a carrier section and the support element shown in FIG. 1.
Figure 6B:
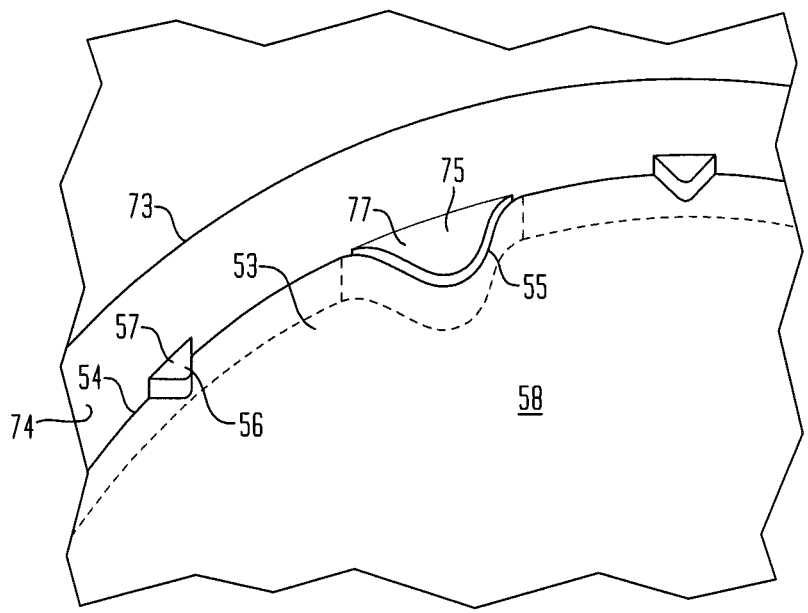
FIG. 6B is an enlarged fragmentary perspective view of elements depicted in FIG. 6A.
Figure 7A:
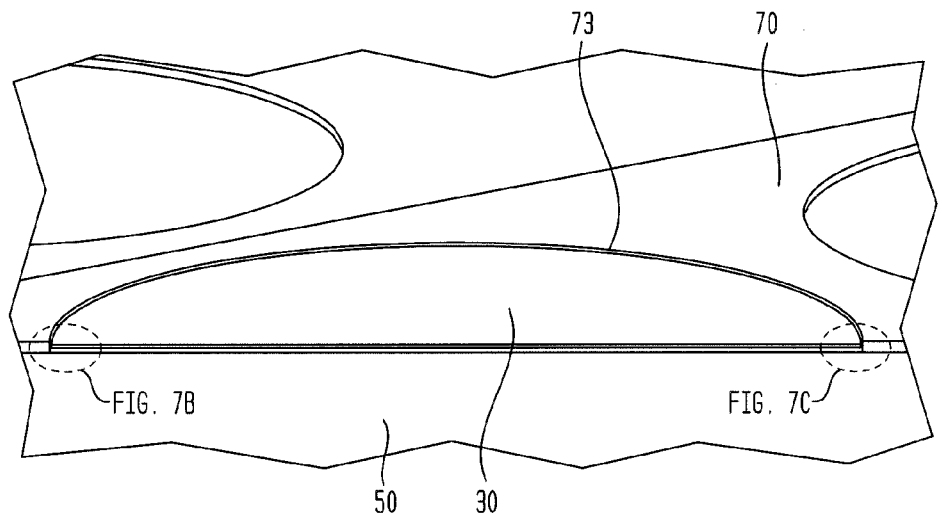
FIG. 7 is an enlarged perspective sectional view of elements of the chemical vapor deposition apparatus illustrated in FIG. 1.
Figure 7B:
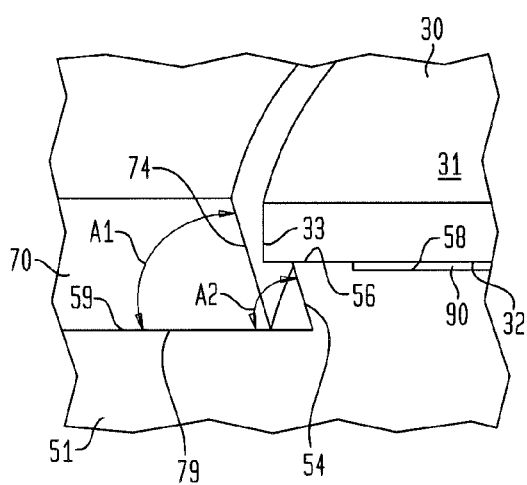
Figure 7C:
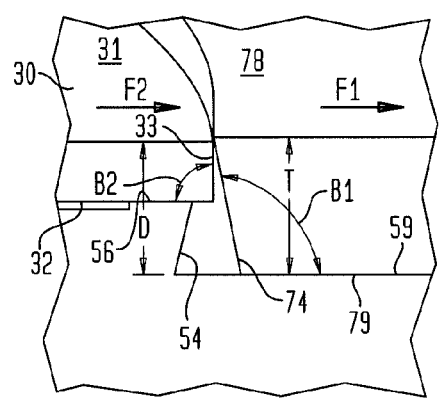

As best shown in FIGS. 6A, 6B, and 7, each platform 53 includes seven support tabs 56 projecting upwardly from the top surface 58 of each platform (e.g., the tabs project from the top surface of the platform towards the top end of the chamber 12 shown in FIG. 1). The support tabs 56 are spaced circumferentially about the platform 53 at the platform circumferential surface 54. The support tabs 56 of each platform 53 are adapted to support the bottom surface 32 of a wafer 30 thereon (such as the wafer shown in FIGS. 1, 3, and 7), such that a bottom surface 32 of the wafer only contacts the platform at the support tabs. A gap 90 is located between the bottom surface 32 of the wafer 30 and the top surface 58 of the platform 53. The presence of such a gap 90 between the bottom surface 32 of the wafer 30 and the top surface 58 of the platform 53 is preferred, because, during operation of the apparatus 10, it may be desirable to allow heat to be primarily transferred from the support element 50 to the wafer 30 across the gap 90, to maximize the evenness of the temperature across the top surface 31 of the wafers.

Although seven support tabs 56 are shown in FIG. 6A, each platform 53 can include any number of support tabs, including, for example, three, five, six, eight, nine, ten, twelve, or fifteen. The support tabs 56 can have any shape and can extend around any portion of the platform circumferential surface 54. In a preferred embodiment, each support tab 56 has a very small top surface 57 compared to the top surface 58 of the platform 53.

As can be seen in FIG. 7, the portion of the platform circumferential surface 54 of each platform 53 that is closest to the rotational axis 52 of the support element 50 (i.e., the left side of FIG. 7) defines an acute angle A2 (i.e., less than 90°) with respect to the upper surface 59 of the support element. The platform circumferential surface 54 is adapted to exert a downward force onto an aperture circumferential surface 74 of the carrier section 70 (to be described below). The portion of the platform circumferential surface 54 that is farthest from the rotational axis 52 may define any angle with respect to the upper surface 59 of the support element, although an acute angle is shown in FIG. 7.

Referring again to FIG. 1, the support element 50 is adapted to releasably engage one or more carrier sections 70. Each carrier section 70 can be formed largely or entirely from one or more materials such as molybdenum, graphite, silicon carbide, boron nitride, aluminum nitride, or other refractory materials. Each carrier section 70 can be made from the same material or a different material than the support element 50. Each carrier section 70 can be supported on the upper surface 59 of the main body 51 of the support element 50, such that the top surface of each carrier section is oriented substantially parallel to the upper surface of the support element. As shown in the figures, each carrier section 70 extends around approximately a 120° arc around the rotational axis 52, such that three carrier sections 70 can extend completely around the support element 50. Although three carrier sections 70 are shown in FIG. 3, the apparatus 10 include any number of carrier sections 70, including, for example, two, four, five, six, seven, eight, ten, twelve, or fifteen. Each of the carrier sections preferably extends around an equal arcuate portion of the support element 50 as the other carrier sections.

Each carrier section 70 has three generally circular apertures 73 extending therethrough. Each aperture 73 is adapted to hold a wafer 30 on carrier elements (shown in FIGS. 4, 6A, and 6B) during transport into and out of the chamber 12. As shown in the figures, three carrier sections 70 extending completely around the support element 50 can provide nine apertures 73 across all of the carrier sections. Although each carrier section 70 is shown in FIG. 3 as having three apertures 73, each carrier section can include any number of apertures, including, for example, two, four, five, six, seven, eight, ten, twelve, or fifteen.

Each of the carrier sections preferably includes an equal number of apertures 73 arranged in a similar geometric configuration as in the other carrier sections. Although the apertures 73 are shown as extending in an arc along a peripheral edge 71 of each respective carrier section 70, the apertures 73 may be arranged in any geometric configuration within each carrier section 70. Although the apertures 73 are shown as generally circular, in other embodiments (not shown), the apertures can have any other shape, including, for example, square, hexagonal, or octagonal. In preferred embodiments, each aperture 73 approximately matches the shape of the wafer 30 that is desired to be carried in the carrier sections.

Taken together, all of the carrier sections 70 in a single chemical vapor deposition apparatus 10 (e.g., three carrier sections) preferably include the same number of apertures 73 as the number of platforms 53 in the support element 50, such that each aperture can be placed around a corresponding platform. The apertures 73 in each carrier section 70 preferably are arranged in a corresponding geometric configuration as the corresponding platforms 53 in the support element 50.

Figure 4:
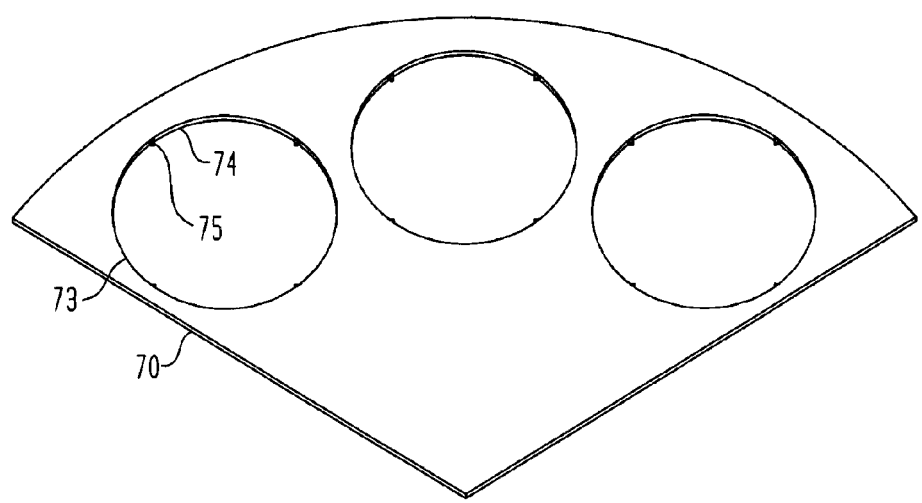
FIG. 4 is a top plan view of a carrier section shown in FIG. 3.

As best shown in FIGS. 4 and 6A, four carrier elements 75 extend radially inward from an aperture circumferential surface 74 of each aperture 73. Although four carrier elements 75 are shown, each aperture 73 can include any number of carrier elements, including, for example, three, five, six, seven, eight, ten, twelve, or fifteen. Preferably, the number of carrier elements 75 included in each aperture 73 is equal to the number of recesses 55 extending into each corresponding platform 53. Preferably, the four carrier elements 75 are located approximately at the same circumferential locations about the aperture 73 as the respective recesses 55 extending into a corresponding platform 53. The carrier elements 75 can have any shape and can extend around any portion of the aperture circumferential surface 74. In a preferred embodiment, each carrier element 75 has a very small top surface 77 compared to the area of the aperture 73.

As shown, for example, in FIG. 6A, when the carrier sections 70 are engaged with the support element 50, each aperture 73 fits around a corresponding platform 53 such that the aperture circumferential surface 74 of the aperture is adjacent to the platform circumferential surface 54 of the platform around the circumferences thereof. The engagement of each aperture 73 around a corresponding platform 53 serves as a mechanism of locating the carrier sections onto the support element 50. The aperture circumferential surfaces 74 of the aperture 73 serve as locating features of each carrier section, and the platform circumferential surfaces 54 of the corresponding platform 53 serve as corresponding locating features of the support element 50.

As can be seen in FIG. 7, when the carrier sections 70 are engaged with the support element 50, an inner portion of the aperture circumferential surface 74 of each aperture 73 that is closest to the rotational axis 52 of the support element (i.e., the left side of FIG. 7) defines an acute angle A1 (i.e., less than 90°) with respect to the bottom surface 79 of the carrier section. The inner portion of the aperture circumferential surface 74 is adapted to approximately mate with a corresponding inner portion of the platform circumferential surface 54 defining an acute angle A2 with respect to the top surface 59 of the support element 50, such that the platform circumferential surface can exert a downward force onto the aperture circumferential surface during rotation of the support element about the rotational axis 52.

An outer portion of the aperture circumferential surface 74 of each aperture 73 that is farthest from the rotational axis 52 of the support element 50 (i.e., the right side of FIG. 7) defines an obtuse angle B1 (i.e., greater than) 90° with respect to the bottom surface 79 of the carrier section 70. The obtuse angle B1 preferably is greater than the substantially right angle B2 defined between an outer circumferential surface 33 of a wafer 30 located within the aperture 73 and the bottom surface 32 of the wafer. The distance D between the upper surface 59 of the support element 50 and a top surface 31 of the wafer 30 preferably is less than the thickness T of the carrier section 70, so that the outer portion of the aperture circumferential surface 74 can be adapted to exert a downward force onto the top surface of the wafer during rotation of the support element 50 about the rotational axis 52. However, it is preferred that the distance D between the upper surface 59 of the support element 50 and a top surface 31 of the wafer 30 is only slightly less than the thickness T of the carrier section 70, so that during operation of the apparatus 10, process gasses flowing across the top surfaces 78 of the carrier sections and the top surfaces of the wafers can experience a minimal amount of flow disruption due to passing over an uneven surface.

Referring again to FIG. 1, a heating element 60 is mounted within the chamber 12 and surrounds the spindle 40 below the fitting 46. The heating element 60 can transfer heat to the bottom surface of the support element 50, principally by radiant heat transfer. Heat applied to the bottom surface of the support element 50 can flow upwardly through the body 51 of the support element 50 to the top surface thereof. Heat can pass upwardly to the bottom surface of each wafer 30 and each carrier section 70, and upwardly through the wafers 30 and the carrier sections 70 to the top surfaces thereof. Heat can be radiated from the top surfaces of the wafers 30 and from the top surfaces of the carrier sections 70 to the colder elements of the process chamber 12 as, for example, to the walls 20 of the process chamber 12 and to the gas inlet manifold 14. Heat can also be transferred from the top surface of the top surfaces of the wafers 30 and the top surfaces of the carrier sections 70 to the process gas passing over these surfaces.

The chamber 12 also includes an outer liner 28 that reduces process gas penetration into the area of the chamber containing the heating element 60. In an example embodiment, heat shields (not shown) can be provided below the heating element 60, for example, disposed parallel to the support element 50, to help direct heat from the heating element 60 upwards towards the support element 50 and not downwards towards the base plate 24 at the bottom end of the chamber 12.

The chamber 12 is also equipped with an exhaust system 62 arranged to remove spent gases from the interior region 26 of the chamber. The exhaust system 62 includes an exhaust manifold 63 at or near the bottom of the chamber 12. The exhaust manifold 63 is coupled to an exhaust conduit 64 that extends downward through the base plate 24 and is configured to carry spent gasses out of the reaction chamber 12. The exhaust manifold 63 extends around the periphery of the chamber 12 below the top of the spindle 40 and below the support element 50. The conduit 64 in turn is connected to a pump 65 or other vacuum source.

Use of the exhaust manifold 63 to provide flow rate restriction can result in parasitic deposition of solid particles (e.g., products of the reactants) formed in and around the exhaust manifold during operation of the apparatus 10. Such solid particles can be removed, for example, by moveable plungers, as shown and described in co-pending U.S. patent application Ser. No. 12/848,540, filed Aug. 2, 2010, the disclosure of which is hereby incorporated by reference herein.

As shown in FIGS. 3 and 4, the apparatus 10 can further include a fork 80 that can be adapted to be used as a handle for transporting a carrier section 70 into and out of the chamber 12. The fork 80 can include a plurality of clips 82 that can be removably clamped onto a carrier section 70 at the peripheral edge 71. The fork 80 can include a handle 84 that is adapted to be grasped by a user or a loading mechanism (not shown) that is capable of moving the carrier sections 70 from the antechamber 17 into the chamber 12 and engaging the carrier sections 70 with the support element 50 in the operative condition, and also capable of moving the carrier sections 70 off of the support element 50 and into the antechamber 17. The fork 80 can also include a shelf 86 that is adapted to support the peripheral edge 71 of a carrier section 70, such that the peripheral edge can be clamped between the shelf and one or more clips 82.

Referring now to FIGS. 6A and 6B, during the process of placing a carrier section 70 onto a support element 50, a wafer 30 being supported on the carrier elements 75 can be transferred to be supported on the support tabs 56, such that after the carrier section is engaged onto the support element, the wafer does not contact any of the carrier elements. For example, before the carrier section 70 enters a reaction chamber such as the chamber 12 shown in FIG. 1, a wafer can be located in an aperture 73, such that a bottom surface of the wafer rests on top surfaces 77 of respective carrier elements 75. While the carrier section 70 is lowered onto a support element 50, such that the aperture 73 becomes located around the platform 53, the carrier elements 75 are lowered into the recesses 55. When the carrier section 70 is mostly or fully lowered onto the support element 50, the top surfaces 77 of the carrier elements 75 can be located below top surfaces 57 of the support tabs 56 (i.e., closer to the top surface of the main body of the support element as shown in FIG. 6B), such that the bottom surface of the wafer is transferred from resting on the top surfaces of the carrier elements to the top surfaces of the support tabs.

During the process of placing the carrier sections onto the support element 50, the engagement of the apertures 73 of the carrier sections into corresponding platforms 53 of the support element can allow self assembly of the carrier sections onto the support element. That is, the carrier sections 70 can be placed in an approximate position onto the support element 50, and the engagement of the aperture 73 into the corresponding platforms 53 can cause the carrier sections to move into more exact desired positions relative to the support element, thereby providing a self-assembly feature of the carrier sections.

During the process of lifting the carrier section 70 off of the support element 50 (e.g., after the desired treatment of the wafers has been completed), a wafer being supported on the support tabs 56 can be transferred to be supported once again on the carrier elements 75. When the carrier section 70 is lifted off of the support element 50, the top surfaces 77 of the carrier elements 75 are raised above the top surfaces 57 of the support tabs 56, such that the bottom surface of the wafer is transferred from resting on the top surfaces of the support tabs to the top surfaces of the carrier elements. With the wafers supported on the carrier elements 75 within the apertures 73, the wafers will be lifted with the carrier section 70 as it is removed from the support element 50.

Referring now to FIG. 7, during rotation of the support element 50 and the carrier sections 70 engaged thereon about the rotational axis 52, a centrifugal force F1 can exerted on the carrier sections that tends to separate the carrier sections from one another by pushing the carrier sections radially outward from the central axis. The centrifugal force F1 can be relatively large at relatively high rotational speeds. Separation of the carrier sections 70 at relatively high rotational speeds can be prevented by the use of an interlocking feature of each aperture circumferential surface 74 and the corresponding platform circumferential surface 54.

The presence of the acute angle A1 of the aperture circumferential surface 74 relative to the upper surface 59 of the support element 50 and the acute angle A2 of the platform circumferential surface 54 relative to the upper surface of the support element allows the platform circumferential surface to exert a downward force onto the aperture circumferential surface 74, thereby releasably interlocking the carrier section 70 onto the support element and preventing the carrier section from lifting up off of the support element during operation of the apparatus 10.

Given the presence of the centrifugal force F1 acting on the carrier sections 70 during rotation of the support element 50, it is desirable that each carrier section 70 have substantially the same mass and/or mass distribution as the other carrier sections, to reduce any imbalance of the support element and the carrier sections during rotation of the support element.

During rotation of the support element 50 and the carrier sections 70 engaged thereon about the rotational axis 52, a centrifugal force F2 is exerted on the wafer 30 that tends to push it radially outward from the central axis 52. As shown in FIG. 7, the angle B1 of the aperture circumferential surface 74 relative to the upper surface 59 of the support element 50 is greater than the angle B2 of the outer circumferential surface 33 of the wafer 30 relative to the upper surface of the support element, and the distance D from the upper surface of the support element to the top surface 31 of the wafer is less than the thickness T from the upper surface of the support element to the top surface 78 of the carrier section 70. Therefore, the aperture circumferential surface 74 of the carrier section 70 exerts a downward force onto the top surface 31 of the wafer 30, thereby preventing the wafer from lifting up off of the platform 53 and out of the aperture 73 during operation of the apparatus 10.

In operation, in a process according to an embodiment of the invention, the entry opening 16 is opened by lowering the shutter 18. Then, carrier sections 70 with wafers 30 loaded thereon are loaded from the antechamber 17 into the chamber 12 and are placed in the operative position on the support element 50, as shown in FIG. 1. As the carrier sections 70 are placed onto the support element 50, the wafers 30 are transferred from being supported by the carrier sections to being supported by the support element, in a manner as described above with respect to FIGS. 6A and 6B. In this condition, the top surfaces of the wafers 30 face upwardly, towards the gas inlet manifold 14. The entry opening 16 is closed by raising the shutter 18 to the closed position depicted in FIG. 1. The heating element 60 is actuated, and the rotary drive 48 operates to turn the spindle 40 and hence the wafer carrier 50 around central axis 42. Typically, the spindle 40 is rotated at a rotational speed from about 50-1500 revolutions per minute.

Process gas supply units (not shown) are actuated to supply gases through the gas inlet manifold 14. The gases pass downwardly toward the carrier sections 70, over the top surface of the carrier sections and the top surfaces of the wafers 30, and downwardly around a periphery of the support element 50 to the exhaust system 62. Thus, the top surfaces of the carrier sections 70 and the wafers 30 are exposed to a process gas including a mixture of the various gases supplied by the various process gas supply units. Most typically, the process gas at the top surface is predominantly composed of the carrier gas supplied by a carrier gas supply unit (not shown). Because heat is transferred to the wafers primarily by direct heat transfer from the support element 50, variations in heat transfer to the carrier elements have limited effect on the temperature of the wafers. Thus, the wafers can be maintained at uniform temperatures.

The process continues until the desired treatment of the wafers 30 has been completed. Once the process has been completed, the entry opening 16 is opened by lowering the shutter 18. Once the entry opening 16 is open, the carrier sections 70 and the wafers 30 can be removed from the support element 50. As the carrier sections 70 are lifted off of the support element 50, the wafers 30 are transferred from being supported by the support element to being supported by the carrier sections, in a manner as described above with respect to FIGS. 6A and 6B. Finally, the carrier sections 70 and the wafers 30 can be replaced with new carrier sections and wafers for the next operational cycle.

Figure 8:
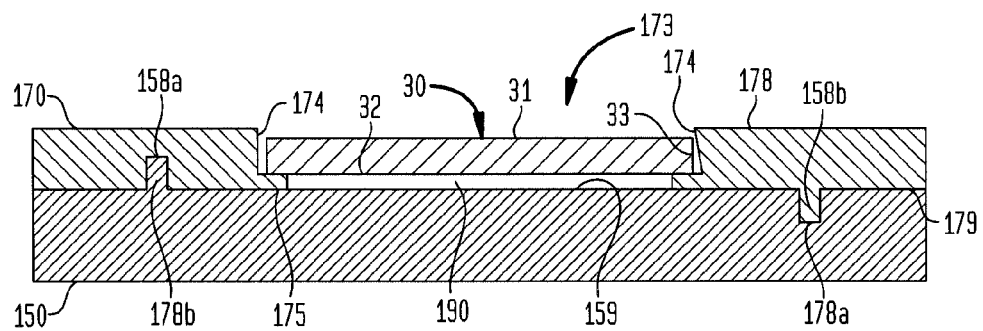
FIG. 8 is an enlarged side sectional view of elements of an alternate embodiment carrier section and support element, suitable for use in the chemical vapor deposition apparatus illustrated in FIG. 1.

Referring now to FIG. 8, an alternate embodiment support element and carrier section suitable for use in the chemical vapor deposition apparatus 10 illustrated in FIG. 1 is shown. A support element 150 is similar to the support element 50 described above, except that the support element 150 does not include platforms protruding upward from an upper surface 159 thereof. Carrier sections 170 are similar to the carrier sections 70 described above, except that a wafer 30 can be held by carrier elements 175 during operation of the apparatus, as well as during insertion of the carrier sections into the reaction chamber, and during removal of the carrier sections from the reaction chamber. Such carrier sections 170 can hold wafers 30 in respective apertures 173 thereof, with the bottom surface 32 of each wafer 30 confronting the support element 150 but not contacting the support element, and the top surface 31 of each wafer exposed at the top surface 178 of the respective carrier section.

A gap 190 located between a bottom surface 32 of the wafer 30 can allow heat to be primarily transferred directly from the support element 150 to the wafer 30, in a similar manner as described with reference to FIG. 7. An outer portion of the aperture circumferential surface 174 can have an obtuse angle with respect to the bottom surface 179 of the carrier section 170, such that during rotation of the support element 150 and the carrier sections, the aperture circumferential surface can be adapted to provide a downward retention force on the outer circumferential surface 33 of the wafer 30, in a similar manner as described above with reference to FIG. 7.

Rather than using the platforms and apertures as a mechanism for locating the carrier sections onto the support element, the support element 150 includes one or more protrusions 158a and/or recesses 158b as locating features. The carrier sections 170 can include one or more protrusions 178a that can be adapted to fit into corresponding recesses 158b of the support element 150. The carrier sections 170 can include one or more recess 178b that can be adapted to accommodate the insertion of corresponding protrusions 158a of the support element. The support element 150 and the carrier sections 170 can include either or both such protrusions and corresponding recesses as locating features.

Figure 9:
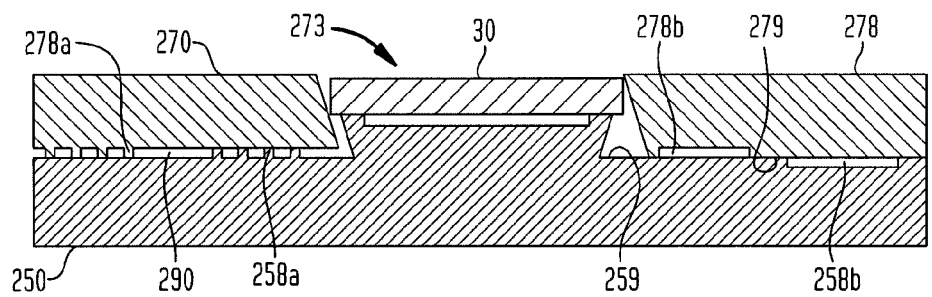
FIG. 9 is an enlarged side sectional view of elements of another alternate embodiment carrier section and support element, suitable for use in the chemical vapor deposition apparatus illustrated in FIG. 1.

Referring now to FIG. 9, another alternate embodiment support element and carrier section suitable for use in the chemical vapor deposition apparatus 10 illustrated in FIG. 1 is shown. A support element 250 and carrier sections 270 are similar to the support element 50 and carrier sections 70 described above, except that features are included that can reduce the surface area of contact between the support element 250 and the carrier sections 270.

Rather than having the bottom surface of the carrier sections supported by contact with a planar upper surface of the support element (as shown, for example, in FIG. 7), the support element 250 can include one or more protrusions 258a extending between the upper surface 259 of the support element and the bottom surface 279 of the carrier sections 270, thereby defining a gap 290 therebetween. Each carrier section 270 can include one or more protrusions 278a extending between the upper surface 259 of the support element and 250 and the bottom surface 279 of the carrier section, thereby defining the gap 290 therebetween. Either or both types of protrusions 258a and 278a can be used in a particular embodiment of the support element 250 and the carrier sections 270 to define the gap 290 therebetween.

The support element 250 can include one or more recesses 258b extending downward from the upper surface 259 thereof, thereby reducing the surface area of contact between the upper surface of the support element and the bottom surface 279 of the carrier sections 270. Each carrier section 270 can include one or more recesses 278b extending upward form the bottom surface 279 thereof, thereby reducing the surface area of contact between the bottom surface of the carrier section and the upper surface 259 of the support element 250. Either or both types of recesses 258b and 278b can be used in a particular embodiment of the support element 250 and the carrier sections 270 to reduce the surface area of contact therebetween.

The inclusion of either or both types of protrusions 258a and 278a and/or either or both types of recesses 258b and 278b in the support element 250 and the carrier sections 270, respectively, can help reduce temperature non-uniformity at the top surface 278 of each carrier section 270 due to a complex shape of the carrier sections, a non-uniform mass distribution between the carrier sections, or droop or warpage of the carrier sections. Such temperature non-uniformity at the top surface 278 can be reduced because the gap 290 and/or the included space within the recesses 258b and 278b can allow for more uniform heat transfer across the gap and/or recesses between the support element 250 and the carrier sections 270.

The use of a chemical vapor deposition apparatus having carrier sections that are removably engageable with s support element, such as in the embodiments described above, can have several potential advantages. For example, for a reactor of a given size, each of a plurality of carrier sections can be lighter and therefore easier to transfer into and out of the reactor than a single large wafer carrier. It can be easier to manufacture each of a plurality of relatively small carrier sections to a tighter manufacturing tolerance than a single large wafer carrier. It can be easier to manufacture a plurality of relatively small carrier sections for a larger scale chemical vapor deposition apparatus than a single relatively large wafer carrier, such that it can be easier to scale the design of chemical vapor deposition apparatus having relatively small carrier sections to a larger size.

A chemical vapor deposition apparatus having a separate support element and carrier sections can include the use of different materials for the support element and carrier sections. For example, the support element can be made of graphite, and the carrier sections can each be made of molybdenum. In an exemplary embodiment, each carrier section can be a composite of multiple materials. In a particular embodiment, each carrier section can be constructed to achieve a desired temperature and/or temperature profile on the top surface thereof, for example, such that the temperature at the top surface of the carrier section can be higher, equal to, or lower than the temperature at the top surfaces of the wafers located within apertures of the carrier section. A chemical vapor deposition apparatus having a separate support element and carrier sections can have reduced thermally induced hoop stress compared to a conventional apparatus having a single unitary wafer carrier.

The invention can be applied in various wafer treatment processes as, for example, chemical vapor deposition, chemical etching of wafers, and the like. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A structure for a chemical vapor deposition reactor, the structure comprising:
   (a) a support element defining oppositely-facing substantially planar upper and lower surfaces and a vertical rotational axis substantially perpendicular to the upper and lower surfaces, the support element having at least one platform projecting upwardly from the upper surface of the support element, the support element having at least one support locating feature including at least one of the platforms; and
   (b) a plurality of carrier sections releasably engaged with the support element, each carrier section including:
   oppositely-facing substantially planar top and bottom surfaces and at least one aperture extending between the top and bottom surfaces;
   an aperture circumferential surface bounding each aperture and extending between the top and bottom surfaces of the carrier section;
   at least one carrier locating feature engaged with the at least one support locating feature of the support element, the carrier and support locating features being configured to prevent the carrier section from disengaging from the support element when the support element is rotated about the rotational axis; and
   at least one carrier element projecting inwardly from each aperture circumferential surface, each carrier element configured to hold a wafer,
   the carrier sections being disposed on the support element with the bottom surfaces of the carrier sections facing toward the upper surface of the support element, so that wafers can be held in the apertures of the carrier sections with one surface of each wafer confronting the support element and an opposite surface exposed at the top surface of the carrier sections, each platform being engaged within a corresponding one of the apertures,
   wherein a portion of the platform circumferential surface that is closest to the rotational axis defines a first acute angle with respect to the upper surface of the support element.

2. A structure as claimed in claim 1, wherein an inner portion of the aperture circumferential surface that is closest to the rotational axis defines a second acute angle with respect to the bottom surface of the carrier section.

3. A structure as claimed in claim 2, wherein the first acute angle and the second acute angle are approximately the same.

4. A structure as claimed in claim 1, wherein an outer portion of each aperture circumferential surface that is farthest from the rotational axis defines an obtuse angle with respect to the bottom surface of the carrier section.

5. A structure as claimed in claim 4, further comprising a wafer positioned in each aperture, wherein a thickness of the carrier section between the top and bottom surfaces thereof is greater than a distance between the upper surface of the support element and a top surface of the wafer.

6. A structure as claimed in claim 1, wherein the one surface of each wafer confronting the support element contacts the support element.

7. A structure as claimed in claim 1, wherein each platform defines a top surface and a platform circumferential surface extending between the top surface thereof and the upper surface of the support element, and wherein each platform is configured to hold a wafer disposed in the corresponding one of the apertures above the carrier elements.

8. A structure as claimed in claim 7, wherein each platform further defines at least one recess extending inward from the platform circumferential surface, and each carrier element is engaged in a corresponding one of the recesses.

9. A structure as claimed in claim 7, wherein each platform is configured to hold a wafer such that a major portion of the lower surface of the wafer is spaced from the top surface of the platform.

10. A structure as claimed in claim 9, wherein each platform includes at least one support tab projecting upwardly from the top surface thereof, each support tab being configured to hold a wafer such that the entire lower surface of the wafer is spaced from the top surface of the platform.

11. A structure as claimed in claim 1, further comprising:
   (c) a reaction chamber having an interior;
   (d) a gas inlet structure communicating with the interior of the chamber for admitting process gasses to form a deposit on wafers held within the interior;
   (e) a heating element mounted within the reaction chamber; and
   (f) a spindle mounted in the reaction chamber, the support element being mounted onto the spindle for rotation therewith about the vertical rotational axis.

12. A structure as claimed in claim 1, wherein the at least one aperture of each carrier section is a plurality of apertures.

13. A structure as claimed in claim 12, wherein the support element is generally disc-shaped and each carrier section is generally in the form of a sector of a circle.

14. A carrier section for transporting wafers into a chemical vapor deposition reactor, the carrier section comprising:
   (a) a body defining oppositely-facing top and bottom surfaces;
   (b) at least one aperture extending through the body, the body defining a circumferential surface bounding each aperture and extending between the top and bottom surfaces of the body; and
   (c) a plurality of carrier elements projecting inwardly from the circumferential surface of each said aperture, the carrier elements of each aperture configured to hold a wafer such that an upper surface of the wafer is exposed at the top surface of the body;
   the carrier section defining engagement surfaces configured to engage a support element,
   wherein the body defines a substantially arcuate peripheral surface, and an inner portion of the circumferential surface of each aperture that is farthest from the peripheral surface defines an acute angle with respect to the bottom surface of the body.

15. A carrier section as claimed in claim 14, wherein an outer portion of the circumferential surface of each aperture adjacent the top surface of the body and that is closest to the peripheral surface defines an obtuse angle with respect to the bottom surface of the body.

16. A carrier section as claimed in claim 15, wherein the acute angle of the inner portion of the circumferential surface of each aperture and the obtuse angle of the outer portion of the circumferential surface of each aperture are complimentary.

17. A carrier section as claimed in claim 16, wherein the circumferential surface of each aperture is in the form of an oblique circular cylinder.

18. A support element for a chemical vapor deposition reactor, the support element comprising:
   (a) a body defining oppositely-facing upper and lower surfaces and a vertical rotational axis substantially perpendicular to the upper and lower surfaces and extending approximately through a center of inertia of the body; and (b) at least one platform projecting upwardly from the upper surface of the body, each platform defining a top surface and a circumferential surface extending between the top surface and the upper surface of the body;

the support element defining engagement surfaces configured to retain one or more carrier sections overlying the upper surface of the body, wherein an inner portion of the circumferential surface of each platform that is closest to the rotational axis defines an acute angle with respect to the upper surface of the body, the engagement surfaces including the inner portions.

19. A support element as claimed in claim 18, wherein the entire circumferential surface of each platform defines an acute angle with respect to the upper surface of the body.

20. A support element as claimed in claim 18, further comprising a plurality of support tabs projecting upwardly from the top surface of each platform, the support tabs configured to hold a wafer such that a lower surface of the wafer is spaced from the top surface of the platform.

21. A support element as claimed in claim 18, wherein the support element is substantially disc-shaped.

22. A support element as claimed in claim 18, wherein the top surface of each platform is substantially round.

* * * * *